United States Patent
Ohashi et al.

(10) Patent No.: US 10,790,436 B2
(45) Date of Patent: Sep. 29, 2020

(54) ORIENTED PIEZOELECTRIC FILM AND METHOD OF MANUFACTURING SAME, AND LIQUID EJECTION HEAD

(71) Applicants: CANON KABUSHIKI KAISHA, Tokyo (JP); FUJI CHEMICAL CO., LTD., Osaka (JP)

(72) Inventors: Yoshihiro Ohashi, Tokyo (JP);
Yoshinori Kotani, Yokohama (JP);
Motokazu Kobayashi, Yokohama (JP);
Chiemi Shimizu, Hirakata (JP); Fumio Uchida, Daito (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/440,098

(22) Filed: Jun. 13, 2019

(65) Prior Publication Data
US 2019/0393407 A1 Dec. 26, 2019

(30) Foreign Application Priority Data
Jun. 20, 2018 (JP) .................................. 2018-116857

(51) Int. Cl.
| | |
|---|---|
| *H01L 41/187* | (2006.01) |
| *H01L 41/047* | (2006.01) |
| *B41J 2/14* | (2006.01) |
| *H01L 41/318* | (2013.01) |
| *H01L 41/09* | (2006.01) |

(52) U.S. Cl.
CPC ...... *H01L 41/1871* (2013.01); *B41J 2/14233* (2013.01); *H01L 41/0477* (2013.01); *H01L 41/0973* (2013.01); *H01L 41/318* (2013.01)

(58) Field of Classification Search
CPC ............. H01L 41/1871; H01L 41/0477; H01L 41/0973; H01L 41/318; B41J 2/14233
USPC ....... 310/358; 501/134; 242/62.9 PZ, 62.9 R
See application file for complete search history.

(56) References Cited

U.S. PATENT DOCUMENTS

| | | | |
|---|---|---|---|
| 8,454,747 B2 | 6/2013 | Hosokura | |
| 9,698,337 B2 * | 7/2017 | Oshima | ............... H01L 41/1871 |

FOREIGN PATENT DOCUMENTS

| | | | | |
|---|---|---|---|---|
| JP | 2008010530 A | * | 1/2008 | ............... H01G 4/12 |
| JP | 2010-189221 A | | 9/2010 | |
| JP | 2016113355 A | * | 6/2016 | ............... H01G 4/30 |

OTHER PUBLICATIONS

Kotani et al., U.S. Appl. No. 16/427,680, filed May 31, 2019.
Ohashi et al., U.S. Appl. No. 16/435,998, filed Jun. 10, 2019.

* cited by examiner

*Primary Examiner* — Thomas M Dougherty
(74) *Attorney, Agent, or Firm* — Venable LLP

(57) ABSTRACT

Provided is use of an oriented piezoelectric film including of a perovskite-type crystal represented by the following general formula (1): $Ba_{1-x}Ca_xTi_{1-y}Zr_yO_3$ ($0 \leq x \leq 0.2$, $0 \leq y \leq 0.2$) (1). The oriented piezoelectric film is formed on an oriented underlayer oriented in a (111) plane and contains first crystals oriented in the (111) plane with respect to a film surface and randomly oriented second crystal grains. The first crystal grains have an average grain diameter of from 300 nm to 600 nm and the second crystal grains have an average grain diameter of from 50 nm to 200 nm.

9 Claims, 6 Drawing Sheets

FIG. 1A
FIG. 1B
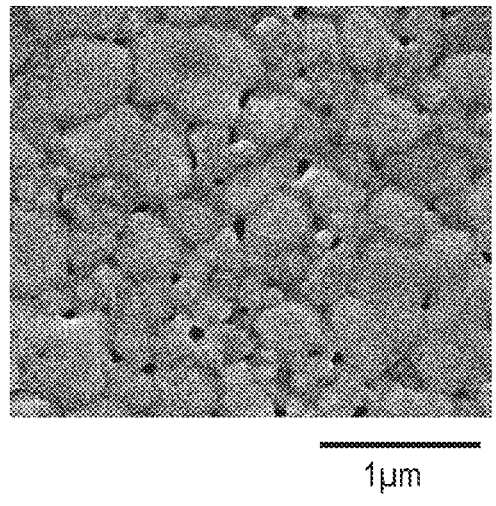
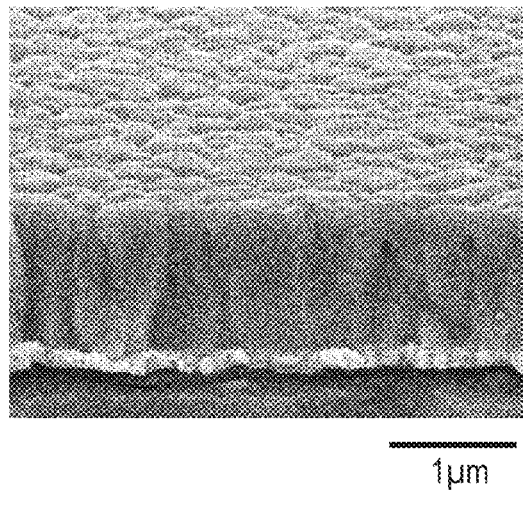

ORIENTED PIEZOELECTRIC FILM AND METHOD OF MANUFACTURING SAME, AND LIQUID EJECTION HEAD

BACKGROUND OF THE INVENTION

Field of the Invention

The present invention relates to an oriented piezoelectric film and a method of manufacturing the same, and a liquid ejection head.

Description of the Related Art

In consideration of environmental loads after disposal of various electronic devices using lead-containing dielectric thin films, there has recently been a demand for the lead-free dielectric thin films. As a preparation process of such films, a sol-gel method has attracted attentions which facilitates precise control of a complex film composition and enables homogeneous application onto a large-area substrate. As such lead-free dielectric thin films, barium titanate (BT)-based films have so far been proposed and examples include BCTZ-based films obtained by adding Ca and Zr to the BT film.

As a usage of the dielectric thin films, they are suited for use as an actuator of an ink jet recording head or the like, but in this case, they are required to have a large piezoelectric constant. In general, films having high orientation tend to show a large piezoelectric constant. When used for such a purpose, therefore, films formed by a film formation process including application, pre-calcination and calcination are required to have high orientation. As an example of forming a BT-based film having high orientation by a sol-gel method, there is a report, as shown in Japanese Patent Application Laid-Open No. 2010-189221, on the manufacture of an oriented film using a single crystal seed layer (MgO).

When the single crystal seed layer having strong orientation as described in the related art was used, a piezoelectric layer formed thereon was likely to form large crystal grains. This causes an excessive increase in Young's modulus of the film, which modulus serves as an index of the hardness of a substance, leading to a problem such as difficulty in having improved piezoelectric performance.

SUMMARY OF THE INVENTION

The present invention is directed to providing a barium titanate-based piezoelectric film having (111) orientation while keeping a low Young's modulus and a method of manufacturing the film.

In one aspect of the invention, there is provided an oriented piezoelectric film including a perovskite-type crystal represented by the following general formula (1):

$$Ba_{1-x}Ca_xTi_{1-y}Zr_yO_3 \ (0 \leq x \leq 0.2, \ 0 \leq y \leq 0.2) \quad (1),$$

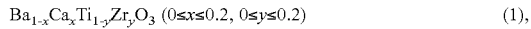

formed on an oriented underlayer oriented in a (111) plane and containing first crystal grains oriented in the (111) plane with respect to the surface of the film and second crystal grains oriented at random, wherein the first crystal grains have an average grain diameter of from 300 nm to 600 nm and the second crystal grains have an average grain diameter of from 50 nm to 200 nm.

In another aspect of the invention, there is also provided a method of manufacturing an oriented piezoelectric film, including:

(1) a step of providing an oriented underlayer oriented in a (111) plane on a substrate;

(2) a step of preparing a first barium titanate-based coating liquid composition containing:
 (a) a sol-gel raw material containing:
  (i) at least one barium component selected from a group consisting of barium alkoxides, hydrolysates of the barium alkoxides and condensates of the hydrolysates of the barium alkoxides and
  (ii) at least one titanium component selected from a group consisting of titanium alkoxides, hydrolysates of the titanium alkoxides and condensates of the hydrolysates of the titanium alkoxides and
 (b) a β-keto ester compound;

(3) a step of preparing a second barium titanate-based coating liquid composition containing:
 (c) a sol-gel raw material containing:
  (i) at least one barium component selected from a group consisting of barium alkoxides, hydrolysates of the barium alkoxides and condensates of the hydrolysates of the barium alkoxides and
  (ii) at least one titanium component selected from a group consisting of titanium alkoxides, hydrolysates of the titanium alkoxides and condensates of the hydrolysates of the titanium alkoxides and
 (d) at least one selected from a group consisting of β-diketones, amines, glycols and organic acids;

(4) a step of applying the first barium titanate-based coating liquid composition onto the substrate and pre-calcining the composition to form a first film;

(5) a step of calcining the first film to form an orientation control layer;

(6) a step of applying the second barium titanate-based coating liquid composition onto the orientation control layer and pre-calcining the composition to form a second film; and (7) a step of calcining the second film to form an oriented piezoelectric film.

Further features of the present invention will become apparent from the following description of exemplary embodiments with reference to the attached drawings.

BRIEF DESCRIPTION OF THE DRAWINGS

FIG. 1 A is a surface SEM image and FIG. 1B is an oblique section SEM image, each of a film obtained in Example 1.

DESCRIPTION OF THE EMBODIMENTS

Figure 2:
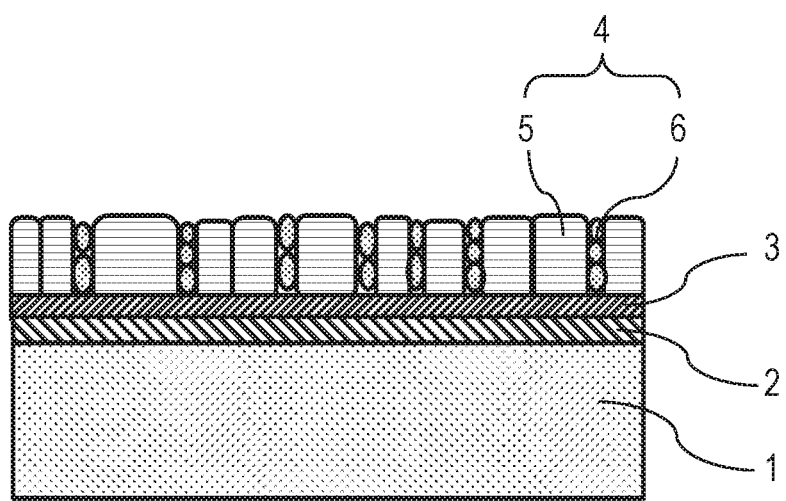
FIG. 2 is a schematic longitudinal sectional view of an oriented piezoelectric film of the invention.

An oriented piezoelectric film of the invention includes a perovskite-type crystal represented by the following general formula (1):

$$Ba_{1-x}Ca_xTi_{1-y}Zr_yO_3 \ (0 \leq x \leq 0.2, \ 0 \leq y \leq 0.2) \quad (1).$$

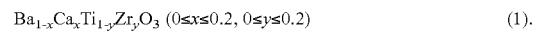

The oriented piezoelectric film is formed on an underlayer oriented in a (111) plane and contains first crystal grains oriented in the (111) plane with respect to the surface of the film and randomly oriented second crystal grains. The first crystal grains have an average grain diameter of from 300 nm to 600 nm and the second crystal grains have an average grain diameter of from 50 nm to 200 nm.

The term "grain diameter" as used herein means a diameter of a circle circumscribing a projected image obtained by projecting each of columnar crystal grains or random crystal grains from above the film. The term "average grain diameter" means an average of grain diameters of these crystal grains.

Composition ratios of calcium and zirconium in the invention are within the following ranges in the above general formula (1): $0 \leq x \leq 0.2$ and $0 \leq y \leq 0.2$, preferably $0 \leq x \leq 0.1$ and $0 \leq y \leq 0.1$ respectively. A (Ba+Ca):(Ti+Zr) ratio may be deviated from 1 and may fall within the following range: $0.95 \leq (Ba+Ca)/(Ti+Zr) \leq 1.05$, preferably $1.00 \leq (Ba+Ca)/(Ti+Zr) \leq 1.02$.

<Preparation of Barium Titanate-Based Coating Liquid Composition>

The oriented piezoelectric film of the invention is manufactured using the following barium titanate-based coating liquid composition. Described specifically, the barium titanate-based coating liquid composition used in the invention contains a raw material compound of a metal oxide represented by the above general formula (1). Here, the raw material compound is a sol-gel raw material containing barium and titanium as essential metal components and at least one metal selected from the group consisting of calcium and zirconium as an optional metal component.

Two barium titanate-based coating liquid compositions are used in the invention. They are a coating liquid composition for forming an orientation control layer (first barium titanate-based coating liquid composition) and a coating liquid composition for forming an oriented piezoelectric film on the orientation control layer (second barium titanate-based coating liquid composition).

The first barium titanate-based coating liquid composition contains a sol-gel raw material having barium and titanium as essential metal components and at least one metal selected from the group consisting of calcium and zirconium as an optional metal component and a β-keto ester compound.

The second barium titanate-based coating liquid composition contains a sol-gel raw material having barium and titanium as essential metal components and having at least one metal selected from the group consisting of calcium and zirconium as an optional metal component. The second barium titanate-based coating liquid composition further contains at least one selected from the group consisting of β-diketones, amines, glycols and organic acids.

First, substances common to the first barium titanate-based coating liquid composition and the second barium titanate-based coating liquid composition will be described below.

The barium titanate-based coating liquid compositions to be used in the invention have, as an essential component, (i) at least one barium component selected from the group consisting of barium alkoxides, hydrolysates of the barium alkoxides and condensates of the hydrolysates of the barium alkoxides. The barium titanate-based coating liquid compositions to be used in the invention also have, as an essential component, (ii) at least one titanium component selected from the group consisting of titanium alkoxides, hydrolysates of the titanium alkoxides and condensates of the hydrolysates of the titanium alkoxides.

In addition, they may contain (iii) at least one calcium component selected from the group consisting of calcium alkoxides, hydrolysates of the calcium alkoxides and condensates of the hydrolysates of the calcium alkoxides as an optional component.

Further, they may contain (iv) at least one zirconium component selected from the group consisting of zirconium alkoxides, hydrolysates of the zirconium alkoxides and condensates of the hydrolysates of the zirconium alkoxides as an optional component.

As raw materials of the barium titanate-based coating liquid compositions, the above-described metal alkoxides or salt compounds such as chlorides or nitrates can be used. From the standpoint of stability of the coating liquid and homogeneity of a film at the time of film formation, the metal alkoxides are preferably used as the raw material.

Examples of the barium alkoxides include barium dimethoxide, barium diethoxide, barium di-i-propoxide, barium di-n-propoxide, barium di-i-butoxide, barium di-n-butoxide and barium di-sec-butoxide. Examples of the titanium alkoxides include titanium tetramethoxide, titanium tetraethoxide, titanium tetra-n-propoxide, titanium tetra-i-propoxide, titanium tetra-n-butoxide and titanium tetra-i-butoxide. Examples of the calcium alkoxides include calcium dimethoxide, calcium diethoxide, calcium di-n-propoxide and calcium di-n-butoxide. Examples of the zirconium alkoxides include zirconium tetraethoxide, zirconium tetra-n-propoxide, zirconium tetra-i-propoxide, zirconium tetra-n-butoxide and zirconium tetra-t-butoxide.

When these metal alkoxide raw materials are used, high reactivity with water induces their rapid hydrolysis with water in the air or by the addition of water and causes turbidity or precipitation of the solution. In order to prevent it, addition of a stabilizer to stabilize the solution is preferred. With respect to specific examples of the stabilizer, the inventors have found respective stabilizers suited for the first barium titanate-based coating liquid composition and the second barium titanate-based coating liquid composition as described later. By appropriately adjusting the orientation ability of these stabilizers, orientation can be controlled. Described specifically, it is presumed that elimination of the stabilizer from the metal alkoxide and timing of a crystal nucleation stage have an influence on the orientation of a film. It is also presumed that when the stabilizer contained in the coating liquid has low orientation ability, the stabilizer is eliminated easily and crystal nucleation proceeds easily in the crystal nucleation stage included in a film calcination process so that epitaxial orientation occurs along the (111) plane of a platinum (Pt) electrode or gold (Au) electrode of a substrate underlayer and a (111) oriented film can be obtained. The orientation ability of the stabilizer described above means interaction between the metal element of the metal alkoxide and the stabilizer.

In the invention, the first barium titanate-based coating liquid composition and the second barium titanate-based coating liquid composition may each contain an organic solvent.

Examples of the organic solvent include alcohols, carboxylic acids, aliphatic or alicyclic hydrocarbons, aromatic hydrocarbons, esters, ketones, ethers, the other chlorinated hydrocarbons and aprotic polar solvents and solvent mixtures of two or more of them.

Preferred examples of the alcohols include methanol, ethanol, 2-propanol, 1-butanol, 2-butanol, 2-methoxyethanol, 2-ethoxyethanol, 1-methoxy-2-propanol, 1-ethoxy-2-propanol, 1-propoxy-2-propanol, 4-methyl-2-pentanol, 2-ethylbutanol, methoxymethylbutanol, ethylene glycol, diethylene glycol and glycerin.

Preferred specific examples of the carboxylic acid include n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid and 3-ethylhexanoic acid.

Preferred specific examples of the aliphatic or alicyclic hydrocarbons include n-hexane, n-octane, cyclohexane, cyclopentane and cyclooctane.

Preferred examples of the aromatic hydrocarbons include toluene, xylene and ethylbenzene.

Preferred examples of the esters include ethyl formate, ethyl acetate, n-butyl acetate, ethylene glycol monomethyl ether acetate, ethylene glycol monoethyl ether acetate and ethylene glycol monobutyl ether acetate.

Preferred examples of the ketones include acetone, methyl ethyl ketone, methyl i-butyl ketone and cyclohexanone.

Preferred examples of the ethers include dimethoxyethane, tetrahydrofuran, dioxane and di-i-propyl ether.

In preparing the first barium titanate-based coating liquid composition and the second barium titanate-based coating liquid composition in the invention, use of the alcohols among the above-described various solvents is preferred from the standpoint of the stability of the solution.

Although the kind or proportion of the respective metal materials of the first coating liquid composition and the second coating liquid composition can be selected as needed, they have preferably the same composition in order to keep piezoelectric characteristics constant.

<Coating Liquid Composition for Orientation Control Layer (First Barium Titanate-Based Coating Liquid Composition)>

It is necessary to appropriately adjust the orientation ability of the stabilizer of the coating liquid composition for forming an orientation control layer so as to cause elimination of the stabilizer from the metal alkoxide and facilitate crystal nucleation during the film calcination process as described above. When the crystal nucleation proceeds easily, a (111) oriented film can be obtained as a result of epitaxial growth with the (111) plane of the Pt electrode, Au electrode or the like as an underlayer. When the orientation ability of the stabilizer is too strong or too weak, crystal nucleation does not proceed smoothly and a film inevitably has random orientation without epitaxial growth with the (111) plane of the Pt electrode, Au electrode or the like as an underlayer. As a result of investigation, it has been found that β-keto ester compounds are preferred in order to provide an orientation control layer having high (111) orientation. More specific examples of the β-keto ester compounds include methyl acetoacetate, ethyl acetoacetate, butyl acetoacetate, i-butyl acetoacetate, sec-butyl acetoacetate, tert-butyl acetoacetate, hexyl acetoacetate, ethyl 3-oxohexanoate and methyl i-butyryl acetate.

The metal alkoxides and stabilizer are dissolved in an organic solvent to prepare the barium titanate-based coating liquid composition. The organic solvent is added preferably in an amount of from 20 to 30 times the total mol of the metal alkoxides.

The amount of the stabilizer may vary depending on the kind of the stabilizer, but it is added, for example, from 1 mol to 4.5 mol, preferably from 2 mol to 4 mol per mol of the barium raw material in the barium titanate-based coating liquid composition. In particular, when ethyl acetoacetate is used as the stabilizer, it is added preferably in an amount of from 2 mol to 4 mol.

The first barium titanate-based coating liquid composition to be used in the invention can be prepared by a step of adding the β-keto ester compound as the stabilizer to the organic solvent and a step of adding a barium alkoxide and a titanium alkoxide and refluxing the resulting mixture. At least one component selected from calcium alkoxides and zirconium alkoxides may be added as an optional component, followed by refluxing.

More specifically, after the metal alkoxide is mixed with a solution obtained by adding the stabilizer to the organic solvent, it is desired to heat and react, in other words, reflux the resulting mixture within a temperature range of from 80° C. to 200° C. for from 2 hours to 10 hours.

It is also preferred to add water or a catalyst and partially hydrolyze the alkoxyl group in advance if necessary. Examples of the catalyst include nitric acid, hydrochloric acid, sulfuric acid, phosphoric acid, acetic acid and ammonia. The coating liquid of the invention may contain a hydrolysate of the metal alkoxide or a condensate thereof.

A water-soluble organic polymer may be added if necessary. Examples of the water-soluble organic polymer include polyethylene glycol, polypropylene glycol and polyvinylpyrrolidone. The water-soluble organic polymer is added preferably in an amount ranging from 0.1 to 10 in terms of a mass ratio to the mass of the oxide of the film.

<Coating Liquid Composition for Oriented Piezoelectric Film (Second Barium Titanate-Based Coating Liquid Composition)>

The stabilizer of the coating liquid composition for forming an oriented piezoelectric film on the above-described (111)-oriented orientation control layer will hereinafter be described. When a β-keto ester compound is used as the stabilizer of the coating liquid composition for an oriented piezoelectric film, the oriented piezoelectric film thus obtained is likely to form large crystal grains oriented in (111) with respect to the surface of the film and it becomes a void-free dense oriented piezoelectric film without small crystal grains. The film therefore has a high Young's modulus and has difficulty in having improved piezoelectric performance. As a result of investigation, it has been found that use of a β-diketone, an amine, a glycol or an organic acid as the stabilizer of the coating liquid for oriented piezoelectric film makes it possible to form an oriented piezoelectric film having randomly oriented crystal grains dispersed between the (111)-oriented crystal grains.

It has been found that in the coating liquid composition using a β-diketone, amine, glycol or organic acid, growth of crystal grains proceeds more slowly than in the coating liquid composition using the β-keto ester compound. Therefore, even when such a coating liquid composition is directly applied onto the (111) plane of the underlayer such as Pt electrode or Au electrode, a (111)-oriented film cannot be obtained.

It has been found, on the other hand, that when the coating liquid composition using a β-diketone, amine, glycol or organic acid is applied onto the (111)-oriented orientation control layer, a film having randomly oriented crystal grains dispersed around the (111)-oriented crystal grains can be obtained. Specific examples of the β-diketone, amine, glycol or organic acid include ethyl 2-methylacetoacetate, ethyl 2-ethylacetoacetate, acetylacetone, 3-methyl-2,4-pentanedione and 2-ethylhexanoic acid.

A method of preparing the coating liquid composition for oriented piezoelectric film may be performed by adding the barium alkoxide, calcium alkoxide, titanium alkoxide, zirconium alkoxide and stabilizer to the organic solvent such as alcohol in order of mention and refluxing the resulting mixture at 100° C. or more. The organic solvent is added preferably in a molar ratio of from 20 to 30 with respect to the total amount of the metal alkoxides.

The barium titanate-based oriented-film coating liquid composition having the metal oxide represented by the above-described general formula (1) as a main component can thus be obtained.

<Method of Manufacturing Oriented Piezoelectric Thin Film>

The oriented piezoelectric film of the invention can be manufactured by the following steps:

(1) a step of providing an underlayer oriented in the (111) plane on a substrate;

(2) a step of preparing a first barium titanate-based coating liquid composition containing:

(a) a sol-gel raw material containing:

(i) at least one barium component selected from the group consisting of barium alkoxides, hydrolysates of the barium alkoxides and condensates of the hydrolysates of the barium alkoxides and (ii) at least one titanium component selected from the group consisting of titanium alkoxides, hydrolysates of the titanium alkoxides and condensates of the hydrolysates of the titanium alkoxides and (b) a β-keto ester compound;

(3) a step of preparing a second barium titanate-based coating liquid composition containing:

(c) a sol-gel raw material containing:

(i) at least one barium component selected from the group consisting of barium alkoxides, hydrolysates of the barium alkoxides and condensates of the hydrolysates of the barium alkoxides and (ii) at least one titanium component selected from the group consisting of titanium alkoxides, hydrolysates of the titanium alkoxides and condensates of the hydrolysates of the titanium alkoxides and (d) at least one selected from the group consisting of β-diketones, amines, glycols and organic acids;

(4) a step of applying the first barium titanate-based coating liquid composition onto the substrate and drying the composition to form a first film;

(5) a step of calcining the first film to form an orientation control layer;

(6) a step of applying the second barium titanate-based coating liquid composition onto the orientation control layer and drying the composition to form a second film; and (7) a step of calcining the second film to form the oriented piezoelectric film.

When the above-described first and second barium titanate-based coating liquid compositions are used to form the oriented piezoelectric film of the invention, an inert gas atmosphere such as dry air or dry nitrogen is preferably used as an application atmosphere. More specifically, the film is formed in a drying atmosphere having preferably a relative humidity of 30% or less.

As the application method of the coating liquid composition for forming the oriented piezoelectric film, a known application means such as dipping, spin coating, spraying, printing or flow coating, or a combination thereof, may be employed as needed. The thickness of the oriented piezoelectric film can be controlled by changing a pull-up speed in dipping or a substrate rotation rate in spin coating, or changing the concentration of a coating solution.

As a substrate for forming the oriented piezoelectric film of the invention thereon, for example, a heat-resistant substrate such as silicon substrate or sapphire substrate having a lower electrode thereon is used, though depending on the usage of the film. For the lower electrode to be formed on the substrate, a material having conductivity and unreactive with the oriented piezoelectric film of the invention such as Pt, Au, Ir or Ru is used. A substrate having a lower electrode formed thereon via a bonding layer and an insulator film can also be used. Specific examples include a substrate having a Pt/Ti/SiO$_2$/Si, Pt/TiO$_2$/SiO$_2$/Si, Pt/IrO/Ir/SiO$_2$/Si, Pt/TiN/SiO$_2$/Si, or Pt/Ta/SiO$_2$/Si, Pt/Ir/SiO$_2$/Si stacked structure (lower electrode/bonding layer/insulator film/substrate).

For example, by forming a Ti film as the bonding layer on a thermally oxidized Si substrate by DC sputtering and then forming a Pt film by DC sputtering, a Pt electrode oriented in the (111) plane which is the densest surface can be obtained. This means that an underlayer oriented in the (111) plane can be obtained on the substrate in the step (1).

Next, heat treatment (annealing) of the resulting substrate having the underlayer oriented in the (111) plane is preferably performed as an optional step. More specifically, by annealing the Pt electrode-attached Si substrate and thereby obtaining Pt particles having improved crystallinity and crystal grain diameter, the Pt electrode-attached substrate whose electrode has an enhanced seed effect can be obtained. The annealing of the substrate is performed by heat treatment under the following conditions: typically at 600° C. or more, preferably from 600° C. to 1000° C., more preferably from 900° C. to 1000° C. for from 5 minutes to 10 minutes.

Next, as the step (2), a first barium titanate-based coating liquid composition containing (a) a sol-gel raw material and (b) a β-keto ester compound is prepared.

The sol-gel raw material (a) contains (i) at least one barium component selected from the group consisting of barium alkoxides, hydrolysates of the barium alkoxides and condensates of the hydrolysates of the barium alkoxides. The sol-gel raw material (a) further contains (ii) at least one titanium component selected from the group consisting of titanium alkoxides, hydrolysates of the titanium alkoxides and condensates of the hydrolysates of the titanium alkoxides.

The sol-gel raw material (a) may contain (iii) at least one calcium component selected from the group consisting of calcium alkoxides, hydrolysates of the calcium alkoxides and condensates of the hydrolysates of the calcium alkoxides as an optional component.

The sol-gel raw material (a) may contain (iv) at least one zirconium component selected from the group consisting of zirconium alkoxides, hydrolysates of the zirconium alkoxides and condensates of the hydrolysates of the zirconium alkoxides as another optional component.

Then, as the step (3), a second barium titanate-based coating liquid composition containing (c) a sol-gel raw material and (d) at least one selected from the group consisting of β-diketones, amines, glycols and organic acids is prepared.

The sol-gel raw material (c) contains (i) at least one barium component selected from the group consisting of barium alkoxides, hydrolysates of the barium alkoxides and condensates of the hydrolysates of the barium alkoxides. The sol-gel raw material (c) further contains (ii) at least one titanium component selected from the group consisting of titanium alkoxides, hydrolysates of the titanium alkoxides and condensates of the hydrolysates of the titanium alkoxides.

The sol-gel raw material (c) may contain (iii) at least one calcium component selected from the group consisting of calcium alkoxides, hydrolysates of the calcium alkoxides and condensates of the hydrolysates of the calcium alkoxides as an optional component.

The sol-gel raw material (c) may contain (iv) at least one zirconium component selected from the group consisting of zirconium alkoxides, hydrolysates of the zirconium alkoxides and condensates of the hydrolysates of the zirconium alkoxides as another optional component.

The step of heat treating the substrate, the step (2) and the step (3) may be performed in any order.

Next, the step (4) of applying the first barium titanate-based coating liquid composition onto the substrate and pre-calcining the composition into a first film and the step (5) of calcining the first film into an orientation control layer are performed.

Then, the step (6) of applying the second barium titanate-based coating liquid composition onto the orientation control layer and pre-calcining the composition into a second film and the step (7) of calcining the second film into an oriented piezoelectric film are performed.

As a result, the orientation state of the metal alkoxides and the stabilizer is controlled during the preparation of the coating liquid composition, and a film formation process to cause epitaxial growth on the underlayer oriented in the (111) plane is carried out, so that a barium titanate-based film having high (111) orientation can be obtained.

It is preferred that the layer formed by the step (5) has a thickness of 30 nm or more to less than 100 nm and the film formed by the step (7) has a thickness of from 100 nm to 150 nm.

The above-described step (4) may be repeated until the thickness of the orientation control layer reaches 30 nm or more to less than 100 nm. Alternatively, the above-described steps (4) and (5) may be repeated until the thickness of the orientation control layer reaches 30 nm or more to less than 100 nm.

Further, the above-described step (6) may be repeated until the thickness of the oriented piezoelectric film reaches 100 nm to 150 nm. Alternatively, the above-described steps (6) and (7) may be repeated until the thickness of the oriented piezoelectric film reaches 100 nm to 150 nm.

As described above, the film formation process includes steps such as drying, pre-calcination and calcination. The drying step is performed by heating with a hot plate or the like at a temperature of from 100° C. to 200° C. for from 1 minute to 5 minutes in order to particularly remove a low boiling point component or adsorbed water molecule. The pre-calcination step is performed with a hot plate, infrared light condensing furnace (RTA) or the like under predetermined conditions. Since the pre-calcination step is performed for solvent removal and pyrolysis or hydrolysis of the metal compound into a complex oxide, it is desirably performed in the air, oxidizing atmosphere or steam-containing atmosphere. Even in heating in the air, sufficient water necessary for hydrolysis can be maintained, supplied from the moisture in the air. Pre-calcination is performed preferably at a temperature of from 200° C. to 700° C. for from 1 to 10 minutes. When a desired film thickness can be obtained by single application, the steps from application of the composition to pre-calcination are performed once, followed by calcination. Alternatively, the steps from application to pre-calcination are performed a plurality of times to obtain a desired film thickness, followed by calcination once at the end. The calcination step is a step for calcining the film obtained by pre-calcination at the crystallization temperature or more to crystallize it and by this step, the oriented piezoelectric film of the invention can be obtained. The calcination atmosphere for this crystallization step is preferably an $O_2$, $N_2$, Ar, $N_2O$ or $H_2$ atmosphere or a mixed gas thereof. The calcination is performed preferably by keeping the film at a temperature of more than 700° C. and 1100° C. or less for from 1 to 60 minutes. The calcination may be performed by rapid thermal annealing treatment (RTA treatment). A temperature elevation rate from room temperature to the above-described calcination temperature is set at preferably from 10° C./sec to 100° C./sec.

<Form of Oriented Piezoelectric Film>

The oriented piezoelectric film of the invention is composed of first crystal grains oriented in the (111) plane with respect to the surface of the film and randomly oriented second crystal grains. The first crystal grains have an average grain diameter of from 300 nm to 600 nm and the second crystal grains have an average grain diameter of from 50 nm to 200 nm. The second crystal grains are preferably dispersed around the first crystal grains. The average grain diameter can be changed within the above-described range by the calcination temperature, thickness of a film obtained by single application, or kind of the stabilizer. However, the first crystal grains have epitaxially grown on the underlying orientation control layer with the (111) plane and the second crystal grains show crystal growth irrespective of the underlayer so that the first crystal grains have a larger grain diameter than the second crystal grains. Described specifically, most of the first crystal grains have a grain diameter within from 2 times to 6 times the grain diameter of the second crystal grains.

An occupancy ratio of the first crystal grains to the second crystal grains (first crystal grains:second crystal grains) per unit area is preferably from 40:60 to 90:10. The occupancy ratio of the first crystal grains to the second crystal grains per unit area can be determined by electron back scattered diffraction (EBSD) evaluation. The first crystal grains are crystal grains oriented in the (111) plane with respect to the film surface and here, the occupation area of them is designated as an area of crystal grains having the (111) plane within 5 degrees with respect to the substrate in EBSD measurement. The second crystal grains are randomly oriented crystal grains and here, the occupation area of them is designated as an area of crystal grains having the (111) plane larger than 5 degrees with respect to the substrate in EBSD measurement. Thus, the occupancy ratio of the first crystal grains to the second crystal grains (first crystal grains:second crystal grains) per unit area can be determined. The degree of 111 orientation is defined as an area ratio of the crystal grains having the (111) plane within 5 degrees with respect to the substrate in the EBSD measurement and the degree of 111 orientation can be represented by the above-described occupancy ratio. For example, when an occupancy ratio of the first crystal grains to the second crystal grains per unit area is 90:10, the degree of 111 orientation becomes 0.90.

The thickness of the oriented piezoelectric film of the invention is typically from 0.1 μm to 4 μm, preferably from 0.5 μm to 3 μm, more preferably from 1 μm to 2 μm.

The Young's modulus of the oriented piezoelectric film of the invention is typically from 60 to 110 GPa, preferably from 70 to 100 GPa, more preferably from 80 to 90 GPa.

One embodiment of the oriented piezoelectric film according to the invention has a structure as shown in the schematic longitudinal sectional view of FIG. 2. In FIG. 2, a substrate is indicated by 1, an intermediate layer by 2 and a lower electrode by 3. An oriented piezoelectric film indicated by 4 is composed of first crystal grains 5 oriented in the (111) plane and randomly oriented second crystal grains 6. A material of the substrate 1 preferably has $SiO_2$ on at least an uppermost layer and, as another requirement, is free of deformation or melting even if a thermal load is given in the drying step after application. In addition, the material preferably has a flat and smooth surface, is capable of preventing diffusion of an element at the time of the heat treatment, and has sufficient mechanical strength. In manufacturing a liquid ejection head by using the piezoelectric film obtained by the present embodiment, the substrate 1 may also serve as a pressure chamber substrate for forming a pressure chamber. For example, for such a purpose, a semiconductor substrate made of silicon (Si) and having, as a surface layer, an $SiO_2$ film obtained by thermal oxidation is preferred, but ceramics such as zirconia, alumina and silica may also be used. If the substrate has $SiO_2$ as an uppermost layer, two or more of these materials may be used in combination or a multilayer constitution obtained by stacking them may be used.

The intermediate layer 2 is a layer having a function of bonding the $SiO_2$ layer therebelow to an electrode thereabove. Not only adhesiveness becomes weak only by a metal such as Pt and an oxide $SiO_2$ but also an electrode and a piezoelectric layer formed thereon may have deteriorated crystallinity. As a result, good piezoelectric performance cannot always be achieved. Too thick intermediate layer is also a problem. When the intermediate layer has a thickness more than 50 nm, the upper piezoelectric layer tends to have deteriorated crystallinity. Therefore, the intermediate layer has preferably a thickness of from 5 nm to 50 nm. As the material of the intermediate layer, Ti or a Ti oxide typified by $TiO_2$ is preferred.

The material of the lower electrode 3 is, for example, a conductive layer having a thickness of from 5 nm to 2000 nm and typical examples of it in a piezoelectric element include metals such as Ti, Pt, Ta, Ir, Sr, In, Sn, Au, Al, Fe, Cr and Ni and oxides thereof. There are several methods for the formation of the electrode such as sol-gel method, sputtering and vapor deposition. Among them, since an electrode can be formed without heating and a (111) oriented film can be obtained easily, sputtering is most preferred. Another method can be used in the invention without a problem insofar as it can provide an oriented film. Although the thickness of the lower electrode is not particularly limited insofar as it allows the electrode to have conductivity, a thickness of from 10 nm to 1000 nm is preferred. After formation, the lower electrode may be patterned into a desired shape.

<Liquid Ejection Head>

The liquid ejection head of the invention has a liquid ejection orifice, a pressure chamber communicated with the liquid ejection orifice and an actuator for causing a volume change in the pressure chamber for ejecting a liquid from the liquid ejection orifice. The actuator has a vibrating plate, a lower electrode, a piezoelectric film made of a barium titanate-based calcined film formed on the substrate and an upper electrode provided in order of mention from the side of the pressure chamber.

Figure 4:
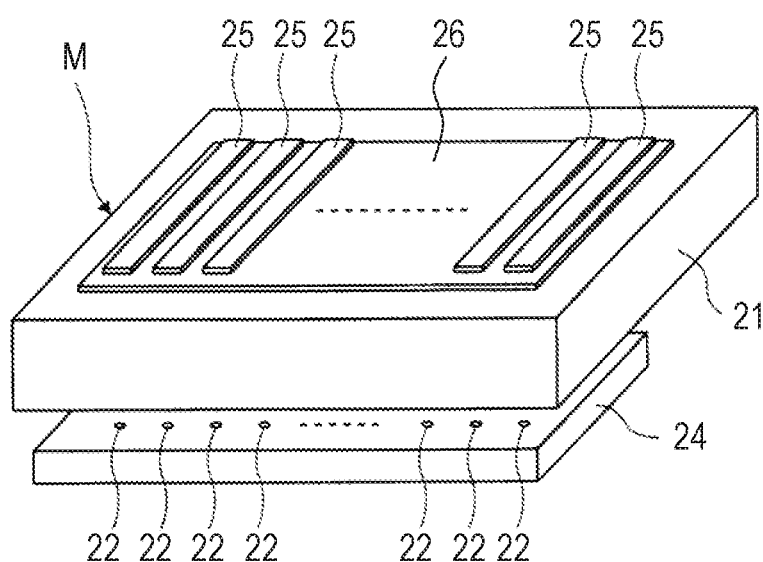
FIG. 4 is a schematic perspective view showing a liquid ejection head according to one embodiment.
Figure 5:
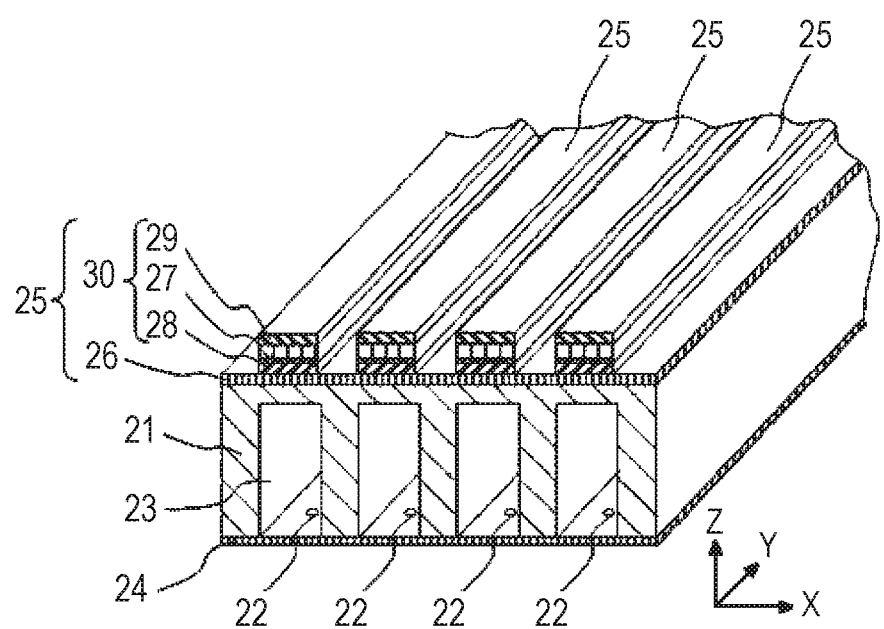
FIG. 5 is a schematic perspective cross-sectional view showing the liquid ejection head according to the one embodiment.
Figure 6:
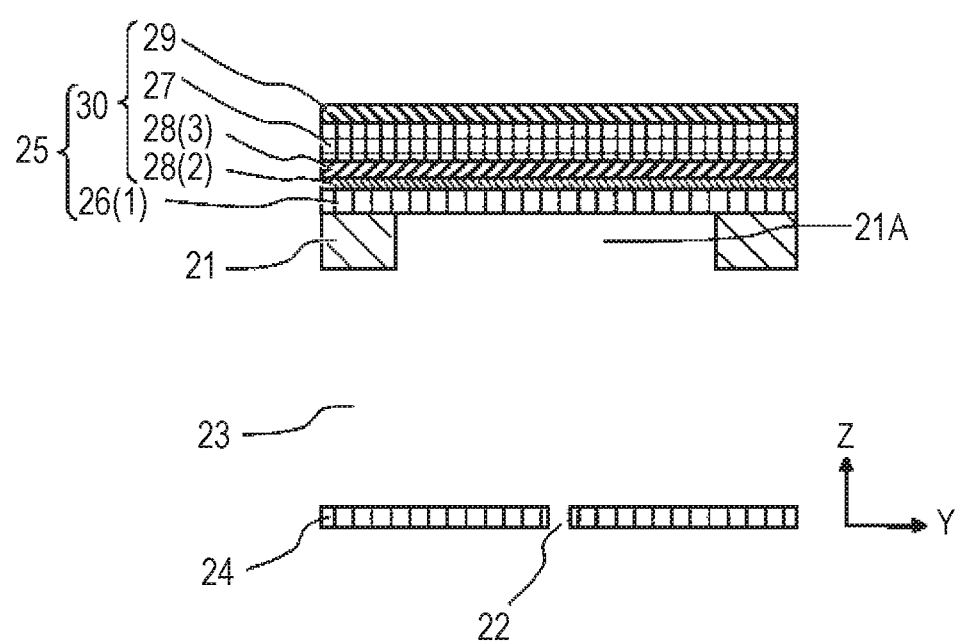
FIG. 6 is a schematic cross-sectional view showing the liquid ejection head according to the one embodiment.

As one embodiment of the liquid ejection head to be used in the invention, one equipped with a piezoelectric film as shown in FIGS. 4 to 6 can be given. This liquid ejection head M is constituted of a liquid ejection head substrate 21, a plurality of liquid ejection orifices 22, a plurality of pressure chambers 23 and actuators 25 provided to correspond to the pressure chambers 23, respectively. The pressure chambers 23 are provided for the liquid ejection orifices 22 and are communicated with the liquid ejection orifices 22, respectively. The actuators 25 cause, by vibration thereof, a volume change of a liquid in the pressure chamber 23 and eject the liquid from the liquid ejection orifices 22. The liquid ejection orifices 22 are formed at predetermined distances in a nozzle plate 24 and the pressure chambers 23 are formed in parallel to each other in the liquid ejection head substrate 21 so as to correspond to the liquid ejection orifices 22, respectively. In the present embodiment, the liquid ejection orifices 22 are provided on the lower surface side of the actuators 25, but they may be provided on the side of the side surface of the actuators 25. The liquid ejection head substrate 21 has, in the upper surface thereof, unillustrated opening portions corresponding to the pressure chambers 23, respectively and the actuators 25 are placed to close the opening portions therewith. The actuators 25 are each constituted of a vibrating plate 26 and a piezoelectric element 30 and the piezoelectric element 30 is constituted of an oriented piezoelectric film 27 and a pair of electrodes (lower electrode 28 and an upper electrode 29). Although the material of the vibrating plate 26 is not particularly limited, a semiconductor such as Si, a metal, a metal oxide or glass is preferred. The piezoelectric element 30 and the vibrating plate 26 may be formed by bonding or adhesion or the lower electrode 28 and the piezoelectric film 27 may be formed directly on the vibrating plate 26 used as a substrate. Instead, the vibrating plate 26 may be directly formed on the liquid ejection head substrate 21.

Examples of the liquid used in the invention include an ink and those of the liquid ejection head include an ink jet recording head.

EXAMPLES

The invention will hereinafter be described more specifically by Examples and Comparative Examples. The invention is however not limited by the following Examples.

Example 1

Formation of Oriented Piezoelectric Film (Oriented Pt Electrode-Attached Substrate)

After formation of a Ti film as a bonding layer on a thermally oxidized Si substrate by DC sputtering, a Pt film was formed by DC sputtering. It was confirmed by X-ray diffraction and electron back scattered diffraction (EBSD) that the Pt layer thus formed was oriented in the (111) plane and had a crystal grain diameter of from 20 nm to 50 nm. The resulting Pt electrode-attached Si substrate was annealed to obtain a Pt layer having an improved degree of orientation (crystallinity and crystal grain diameter). Annealing at 1000° C. for 10 minutes achieved all of an increase in the Pt crystal grains, grain diameter distribution within a range of from 100 nm to 400 nm, an average grain diameter of about 150 nm and improved crystallinity. Thus, an oriented Pt electrode-attached substrate whose Pt electrode had an enhanced seed effect was prepared.

(Coating Liquid Composition for Orientation Control Layer (First Barium Titanate-Based Coating Liquid Composition))

In preparing a coating liquid composition for an orientation control layer, ethyl acetoacetate was used as a stabilizer. After barium di-i-propoxide, titanium-n-butoxide and zirconium n-butoxide were dissolved in a solution obtained by adding ethyl acetoacetate serving as a stabilizer in a solvent mixture of 2-methoxyethanol and methoxymethylbutanol, the resulting solution was refluxed for about 8 hours to prepare the coating liquid composition for orientation control layer. The 2-methoxyethanol:methoxymethylbutanol:ethyl acetoacetate:barium di-i-propoxide:titanium n-butoxide:zirconium n-butoxide molar ratio of the solution was set at 18:12:3:1:0.97:0.03.

(Coating Liquid Composition for Oriented Piezoelectric Film (Second Barium Titanate-Based Coating Liquid Composition))

In preparing a coating liquid composition for an oriented piezoelectric film, 2-ethylhexanoic acid was used as a stabilizer. First, after barium di-ethoxide, titanium n-butoxide and zirconium n-butoxide were dissolved successively in a solvent mixture of 2-methoxyethanol and methoxymethylbutanol, the resulting solution was refluxed at 100° C. for about 24 hours. Then, 2-ethylhexanoic acid as the stabilizer was added, followed by refluxing at 80° C. for about 8 hours to prepare the coating liquid composition for oriented piezoelectric film. The 2-methoxyethanol:methoxymethylbutanol:2-ethylhexanoic acid:barium di-i-propoxide:titanium n-butoxide:zirconium n-butoxide molar ratio of the solution was set at 18:12:3:1:0.97:0.03.

(Formation of Oriented Piezoelectric Film)

By using the first barium titanate-based coating liquid composition (coating liquid composition for orientation control layer) prepared above, an orientation control layer was formed by spin coating on the oriented Pt electrode-attached substrate, which had already been annealed. The resulting layer was subjected to a drying step, that is, heat treatment for 5 minutes on a hot plate set at 150° C., a pre-calcination step, that is, heat treatment for 10 minutes at 450° C. in an infrared heating furnace and then a calcination step at 1000° C. for 10 minutes. After formation of one orientation control layer, the resulting film was evaluated for orientation by EBSD. As a result, the degree of 111 orientation was 0.95.

The degree of 111 orientation is an area ratio of crystal grains having the (111) plane within 5 degrees with respect to the substrate in EBSD measurement. The film thickness at that time was about 50 nm.

Next, by using the second barium titanate-based coating liquid composition (coating liquid composition for oriented piezoelectric film), an oriented piezoelectric film was formed on the resulting orientation control layer. First, the second barium titanate-based coating liquid composition was applied by spin coating. After heat treatment for 5 minutes on a hot plate set at 150° C., a pre-calcination step was carried out by heat treatment for 10 minutes at 450° C. in an infrared heating furnace. Then, calcination was performed at 1000° C. for 10 minutes. The above-described steps were performed seven times to obtain a thickened film.

The cross-section of the film obtained by application in Example was observed using a scanning electron microscope (SEM, "QuantaFEG 250", trade name; product of FEI) at an accelerated voltage of 10 kV.

(Evaluation)

The surface SEM image and oblique section SEM image of the oriented piezoelectric film formed in Example 1 are shown in FIG. 1A and FIG. 1B, respectively. It has been found from FIG. 1B that the first crystal grains oriented in the (111) plane with respect to the film surface are columnar crystals extending continuously from an upper surface of the orientated underlayer to the film surface. The crystal grains had a grain diameter distribution within a range of from 250 nm to 650 nm and had an average grain diameter of 520 nm. On the other hand, the randomly oriented second crystal grains were in granular form, had a grain diameter distribution within a range of from 40 nm to 180 nm and had an average grain diameter of 120 nm. In the film thus obtained, the randomly oriented crystal grains were dispersed around the (111)-oriented columnar crystals. As a result of evaluation of the orientation of the film by EBSD, an occupancy ratio of the first crystal grains to the second crystal grains (first crystal grains:second crystal grains) per unit area was about 80:20 and the degree of 111 orientation was 0.80. Evaluation by EBSD was made using a TSL-EBSD system (product of TSL Solutions).

The randomly oriented crystal grains were dispersed around the (111)-oriented columnar crystals. The oriented piezoelectric film had a thickness of 1.2 μm.

A Lotgering factor, an index of the degree of orientation based on X-ray diffraction, was calculated. The Lotgering factor was calculated based on the following expression (2) by using a peak intensity of diffracted X-ray from a crystal plane to be measured.

$$F=(\rho-\rho 0)/(1-\rho 0) \qquad (2)$$

In the above expression, $\rho 0$ was calculated using an X-ray diffraction intensity ($I_o$) of a non-oriented sample and in the case of a (001) oriented tetragonal crystal, it was determined from the expression (3) as a ratio of the sum of diffraction intensities of the (111) plane to the sum of all the diffraction intensities.

$$\rho 0=\Sigma I_0(111)/\Sigma I_0(hkl) \text{ (in which h, k, l are each an integer)} \qquad (3)$$

In the above expression, $\rho$ was calculated using an X-ray diffraction intensity (I) of an oriented film and in the case of a (111) oriented tetragonal crystal, it was determined, similar to from the expression (3), from the expression (4) as a ratio of the sum of diffraction intensities of the (111) plane to the sum of all the diffraction intensities.

$$\rho=\Sigma I(111)/\Sigma I(hkl) \qquad (4)$$

Figure 3:
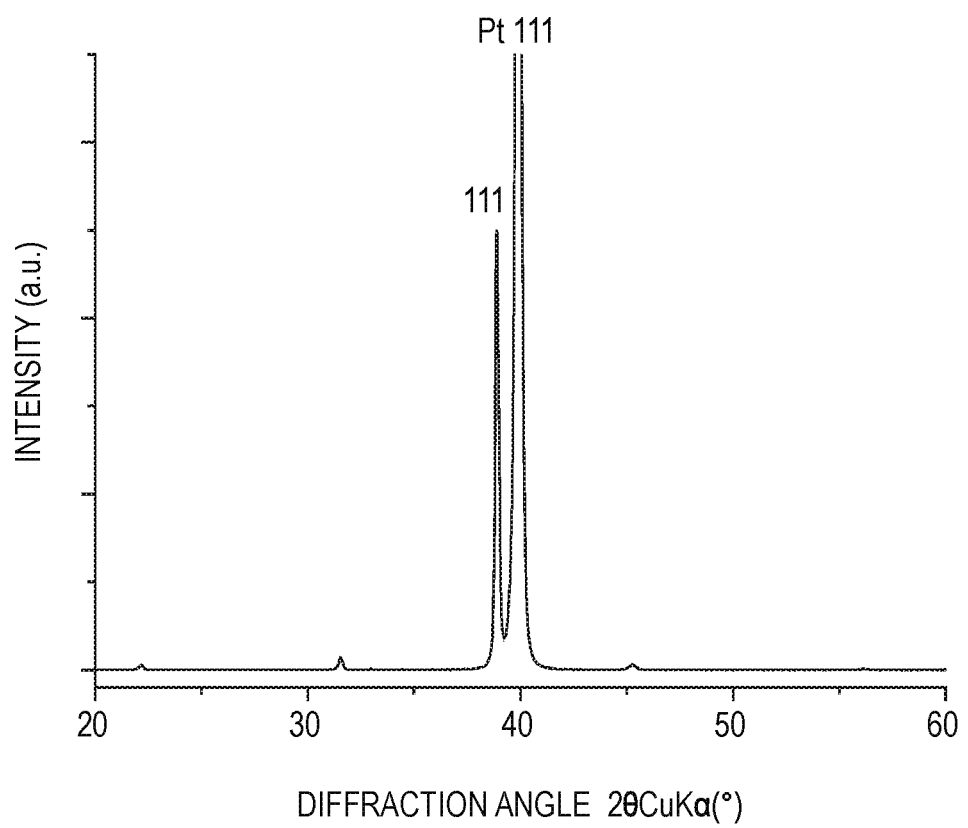
FIG. 3 shows X-ray diffraction results of the film obtained in Example 1.

X-ray diffraction results of the (111)-oriented thick film are shown in FIG. 3. The film shows almost only a diffraction peak of 111 and has a Lotgering factor F of 0.94, showing a high degree of orientation.

(Evaluation of Piezoelectric Characteristics)

Among a piezoelectric stress constant ($e_{31}$), a piezoelectric strain constant ($d_{31}$) and a Young's modulus (Y), there is the following relationship: $d_{31}=e_{31}/Y$. After formation of an upper electrode on the oriented piezoelectric film, a cantilever was manufactured. As a result of evaluation of $e_{31}$, $-e_{31}$ was 12.1 C/m². The Young's modulus of the oriented piezoelectric film at room temperature was measured by a nanoindentation method to be 80 GPa. Based on those results, $-d_{31}$ was 152 pm/V, suggesting that the film obtained above is the oriented piezoelectric film of the invention. Measurement results of the values will be shown later in Table 1 together with the results of Comparative Examples 1 and 2.

Example 2

As a stabilizer of a coating liquid composition for orientation control layer (first barium titanate-based coating liquid composition), ethyl acetoacetate described in Example 1 was replaced by methyl acetoacetate, butyl acetoacetate, i-butyl acetoacetate, sec-butyl acetoacetate, tert-butyl acetoacetate, hexyl acetoacetate, ethyl 3-oxohexanoate and methyl i-butyryl acetate were used and coating liquid compositions for orientation control layer were prepared as in Example 1, respectively. After formation of one orientation control layer by using each of the resulting coating liquid compositions, the resulting layers were evaluated for orientation by EBSD. As a result, it has been found that they have a degree of 111 orientation within a range of from 0.93 to 0.95 so that they can be used as an orientation control layer.

Example 3

As a stabilizer of a coating liquid composition for oriented piezoelectric film (second barium titanate-based coating liquid composition) to be formed on the orientation control layer, following ones were used to prepare the coating liquid compositions for oriented piezoelectric film, respectively. Described specifically, 2-ethylhexanoic acid described in Example 1 was replaced by ethyl 2-methylacetoacetate, ethyl 2-ethylacetoacetate, acetylacetone and 3-methyl-2,4-pentanedione to prepare the coating liquid composition for oriented piezoelectric film as in Example 1. By using each of the resulting compositions, an oriented piezoelectric film was formed on the orientation control layer.

The seven-layer oriented piezoelectric film formed on the orientation control layer was evaluated for orientation by EBSD. The resulting film had a degree of 111 orientation within a range of from 0.75 to 0.80. The crystal grains oriented in the (111) plane with respect to the film surface had a columnar structure, had a grain diameter distribution within a range of from 220 nm to 580 nm and an average grain diameter of 450 nm. On the other hand, the randomly oriented second crystal grains were in granular form, had a grain diameter distribution within a range of from 30 nm to 150 nm and had an average grain diameter of 100 nm. In the film thus obtained, randomly oriented crystal grains were dispersed around the (111)-oriented columnar crystals.

Comparative Example 1

Film formation was performed seven times in the same manner as in Example 1 using only the coating liquid composition for the alignment piezoelectric film (the second barium titanate-based coating liquid composition) prepared in Example 1. As a result of X-ray diffraction measurement, the film thus obtained had a Lotgering factor F of 0.04 and thus showed random orientation compared with the (111) orientation.

After formation of the upper electrode on the oriented piezoelectric film, a cantilever was formed and the Young's modulus at room temperature, $-e_{31}$ and $-d_{31}$ were evaluated. Although the randomly oriented film obtained in the present Comparative Example had a Young's modulus almost on the same level with that of Example 1, it had a low $-e_{31}$ and therefore, it had a piezoelectric stress constant $(-d_{31})$ lower than that of Example 1.

Referential Example 1

Film formation was performed seven times in the same manner as in Example 1 using only the coating liquid composition for the orientation control layer (first barium titanate-based coating liquid composition) prepared in Example 3. As a result of X-ray diffraction measurement, the film thus obtained had a Lotgering factor F of 0.95 and was highly (111) oriented. Observation results under SEM have revealed that the film thus obtained had large crystal grains having (111) orientation with respect to the film surface, had no small crystal grains, and was dense without voids. The Young's modulus of the film at room temperature was measured to be 112 GPa. As a result, it had a lower piezoelectric stress constant $(-d_{31})$ compared with that of Example 1.

TABLE 1

| | Orientation | Young's modulus (GPa) | $-e_{31}$ (C/m$^2$) | $-d_{31}$ (pm/V) |
|---|---|---|---|---|
| Example 1 | 111 | 80 | 12.1 | 152 |
| Comparative Example 1 | Random | 78 | 10.0 | 128 |
| Reference Example 1 | 111 | 112 | 8.2 | 73 |

The invention makes it possible to provide a barium titanate-based film showing high piezoelectric characteristics and having high (111) orientation.

The invention makes it possible to provide a barium titanate-based film containing large crystal grains oriented in the (111) plane and randomly oriented small crystal grains and therefore capable of satisfying both a low Young's modulus and (111) orientation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-116857, filed Jun. 20, 2018, which is hereby incorporated by reference herein in its entirety.

What is claimed is:

1. An oriented piezoelectric film comprising a perovskite-type crystal represented by general formula (1):
    $Ba_{1-x}Ca_xTi_{1-y}Zr_yO_3$ (0≤x≤0.2, 0≤y≤0.2) (1), formed on an oriented underlayer oriented in a (111) plane, and containing first crystal grains oriented in the (111) plane with respect to a surface of the film and second crystal grains oriented at random,
    wherein the first crystal grains have an average grain diameter of from 300 nm to 600 nm, and
    wherein the second crystal grains have an average grain diameter of from 50 nm to 200 nm.

2. The oriented piezoelectric film according to claim 1, wherein the second crystal grains are dispersed around the first crystal grains.

3. The oriented piezoelectric film according to claim 1, wherein the first crystal grains are columnar crystals continuously extending from an upper surface of the oriented underlayer to the surface of the film.

4. The oriented piezoelectric film according to claim 1, wherein an occupancy ratio of the first crystal grains to the second crystal grains (first crystal grains:second crystal grains) per unit area is from 40:60 to 90:10.

5. The oriented piezoelectric film according to claim 1, wherein the oriented underlayer is an electrode oriented in the (111) plane and contains at least one of platinum and gold.

6. The oriented piezoelectric film according to claim 1, further comprising a void.

7. The oriented piezoelectric film according to claim 1, having a film thickness of from 0.1 μm to 4 μm.

8. The oriented piezoelectric film according to claim 1, having a Young's modulus of from 60 GPa to 110 GPa.

9. A liquid ejection head, comprising:
    a liquid ejection orifice, a pressure chamber communicating with the liquid ejection orifice and an actuator for causing a volume change in the pressure chamber for ejecting a liquid from the liquid ejection orifice,
    wherein the actuator has a vibrating plate, a lower electrode, the oriented piezoelectric film as set forth in claim 1 and an upper electrode provided in the order mentioned from a side of the pressure chamber.

* * * * *